United States Patent
Jacquet

(10) Patent No.: US 7,327,594 B2
(45) Date of Patent: Feb. 5, 2008

(54) READ-ONLY MEMORY WITH TWISTED BIT LINES

(75) Inventor: Francois Jacquet, Froges (FR)

(73) Assignee: STMicroelectronics SA, Montrouge (FR)

( * ) Notice: Subject to any disclaimer, the term of this patent is extended or adjusted under 35 U.S.C. 154(b) by 61 days.

(21) Appl. No.: 11/433,046

(22) Filed: May 12, 2006

(65) Prior Publication Data

US 2006/0256604 A1    Nov. 16, 2006

(30) Foreign Application Priority Data

May 13, 2005    (FR) ................................. 05 04870

(51) Int. Cl.
*G11C 17/00* (2006.01)
*G11C 5/02* (2006.01)

(52) U.S. Cl. .......................... 365/94; 365/63; 365/51; 257/776

(58) Field of Classification Search .................. None
See application file for complete search history.

(56) References Cited

U.S. PATENT DOCUMENTS 5,107,459 A * 4/1992 Chu et al. .................. 365/63
6,320,781 B1   11/2001 Li et al.
6,611,062 B2 *  8/2003 Kurjanowicz ................ 257/776
7,259,464 B1 *  8/2007 Batra .......................... 257/776
2002/0140106 A1  10/2002 Kurjanowicz

FOREIGN PATENT DOCUMENTS

EP    0 452 648 A1    10/1991

OTHER PUBLICATIONS

Preliminary Search Report for French Patent Application No. 0504870 dated Feb. 9, 2006.

* cited by examiner

*Primary Examiner*—Amir Zarabian
*Assistant Examiner*—Michael Weinberg
(74) *Attorney, Agent, or Firm*—Lisa K. Jorgenson; Jose Gutman; Fleit Kain Gibbons Gutman Bongini & Bianco P.L.

(57) ABSTRACT

Bit lines (BL0, BL0R, BL1, BL1R, . . . ) of a ROM memory array with differential detection reading are arranged within two overlaid metallization levels so as to increase the read reliability of binary values stored in the array. The ROM array is divided into matrix segments (100, 101, . . . ) aligned parallel to the bit lines. The bit lines are shifted horizontally and/or vertically within transition regions (T) located between the segments of matrix, by effecting circular permutations between the positions of the bit lines that are divided up into groups of four.

16 Claims, 5 Drawing Sheets

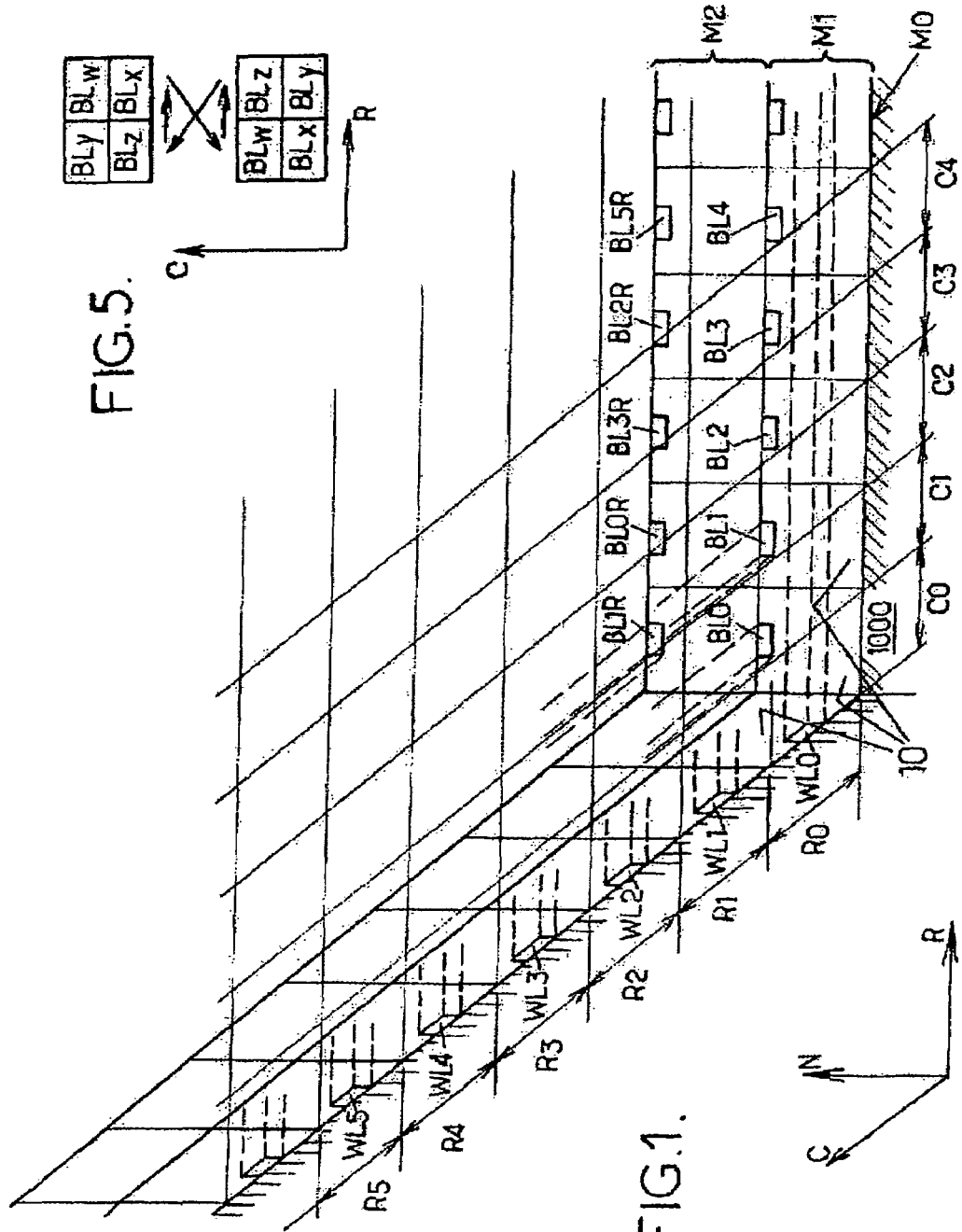
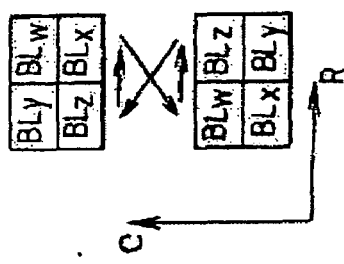
FIG. 1.
FIG. 5.

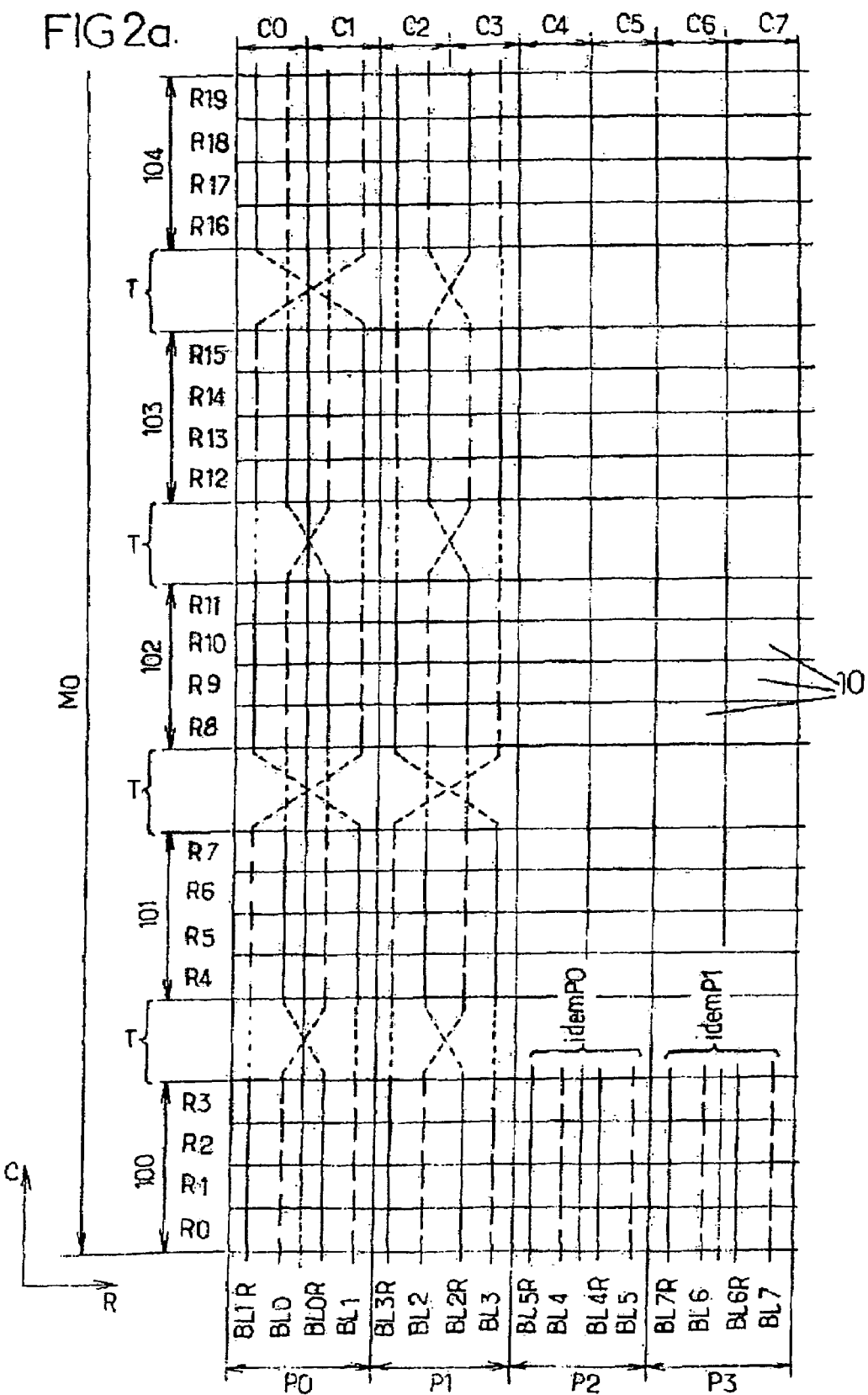

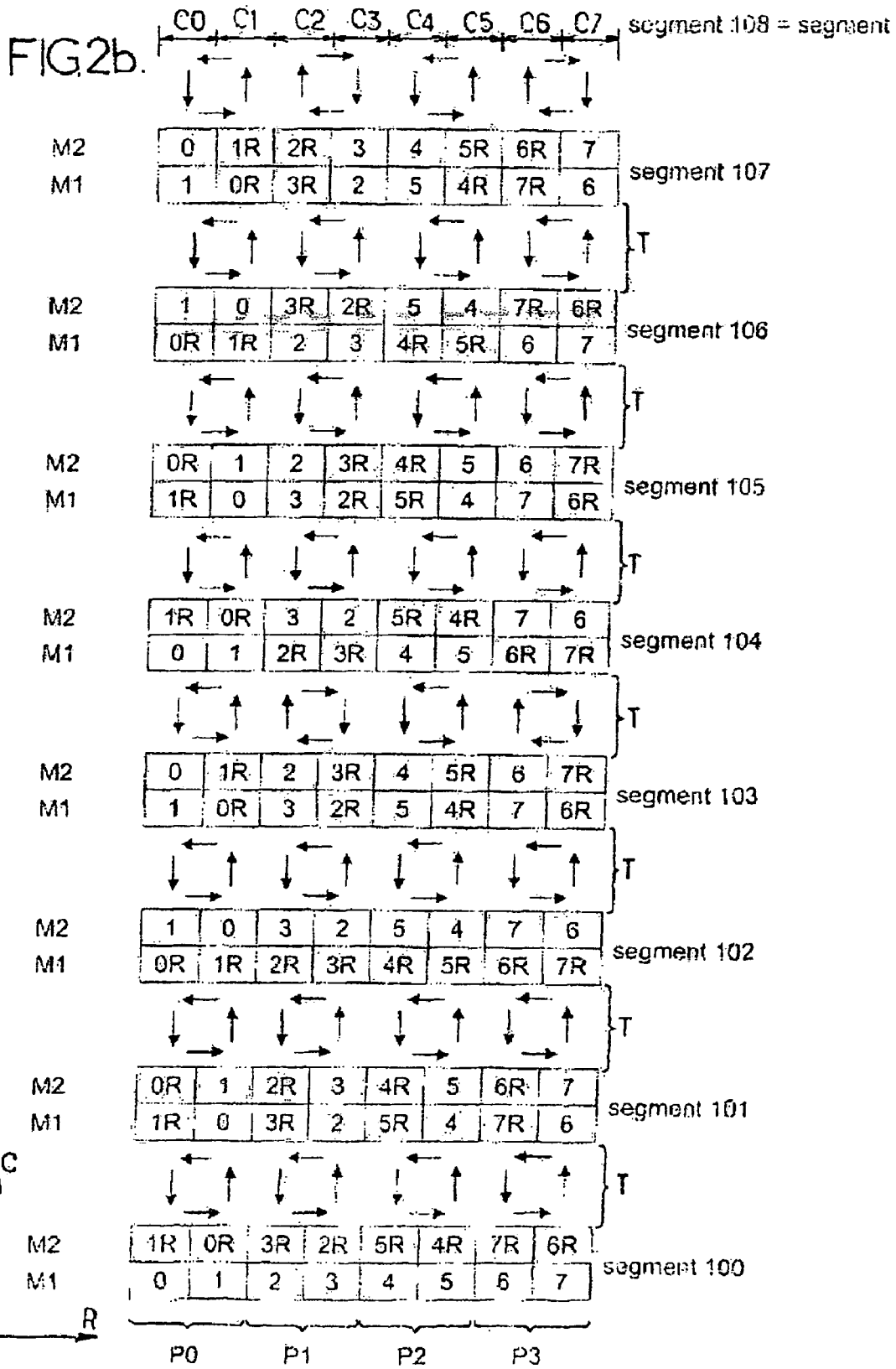

READ-ONLY MEMORY WITH TWISTED BIT LINES

CROSS-REFERENCE TO RELATED APPLICATION

This application is based upon and claims priority from prior French Patent Application No. 05 04870, filed on May 13, 2005, the entire disclosure of which is herein incorporated by reference.

BACKGROUND OF THE INVENTION

1. Field of the Invention

The present invention relates to the field of read only memory devices, and more particularly to a ROM (Read-Only-Memory) array with twisted bit lines.

2. Description of the Related Art

In a known manner, a ROM memory cell comprises a single MOS (Metal Oxide Semiconductor) transistor. Owing to this very simple structure, a ROM array can theoretically have a very high level of integration. However, electromagnetic interactions occur between certain bit lines of the ROM array when these lines get too close to one another. A binary value stored in a cell may then be misread by means of a bit line connecting this cell, because of the interactions between this line and other bit lines situated close by. The integration level of a ROM array is therefore limited by the interactions between the bit lines.

Various improvements are already being used for combining a high level of integration of the ROM array with a good read reliability of the stored information.

One of these improvements can be mentioned here which involves the pairing of bit lines within the ROM array. The binary value stored in each cell is then read differentially: the read signal that is detected on the bit line connecting the cell in which the binary value is read is compared with a signal reference level supplied by the bit line that belongs to the same pair as the read bit line. For this purpose, the two bit lines of a same pair are connected to inputs of a differential amplifier disposed at the output of the memory array. Thus, each bit line also serves as internal reference for the memory array during a read operation carried out by means of the bit line with which it is paired. However, such a method only provides a sufficiently reliable read operation if both bit lines of a same pair are disposed in an identical or symmetrical manner within the memory array.

For this purpose, some ROM arrays are divided into two symmetrical portions, and the bit lines of a same pair respectively belong to one and the other of the two portions. Such a ROM array configuration is referred to as 'open'. The output interface of the array and the read differential amplifiers are then situated between the two portions of the array, so as to be connected at their inputs to the bit lines of each pair respectively output from the two portions of array. However, the connection of the output interface to circuits external to the memory array, for which the values being read are intended, is not straightforward by reason of the space occupied by the two portions of the array on either side of the interface.

A second configuration of a ROM array with differential read mode has been proposed, which does not present the aforementioned size and space issue around the output interface. This second configuration is referred to as 'folded'. Each of the two portions of array is inserted into the other portion, by alternating the rows of ROM cells of each portion on a common part of substrate. But in this case, the configuration of the word lines respectively associated with the rows of cells, above the surface of the substrate, requires the provision of spacing intervals between the cells. This then results in an increase of 25% in the surface area of the ROM array which limits the level of integration.

In order to avoid this increase in the surface area of the ROM array, a third configuration has been proposed, according to which the bit lines are distributed between two levels of metallization overlaid above the substrate surface. The ROM array is then divided into segments of cell matrix, in the direction of the bit lines. Within each segment, the cells are connected to the bit line situated in the lower metallization level, in other words the metallization level closest to the substrate surface. Between two successive segments of matrix, the bit lines are exchanged between the two levels. Although this third configuration of a ROM array is also of the type with differential read mode, the read operation reliability obtained again becomes insufficient for higher levels of integration. Indeed, it has been observed that, within each matrix segment, a given bit line interacts with another bit line when the two bit lines have respective portions adjacent to one another within the same metallization level. In other words, the read signal detected on one bit line may be altered by the electrical state of some of the other bit lines of the ROM array.

Finally, the document U.S. Pat. No. 6,657,880 describes a static random access memory, or SRAM, array in which the bit lines are displaced between two successive segments of the memory array. These displacements are either parallel to the memory plane, in the direction of the word lines, or perpendicular to the memory plane. A bit line that is displaced perpendicularly to the memory plane is transferred between two different metallization levels. Such a configuration of the bit lines is suitable for an SRAM memory array, where each memory cell comprises six transistors. However, it is not suitable for a ROM array, where each cell is much smaller since it only comprises a single transistor.

Accordingly, there exists a need for overcoming the disadvantages of the prior art as discussed above.

SUMMARY OF THE INVENTION

One aim of the present invention is therefore to allow a maximum level of integration for a ROM array, while at the same time guaranteeing a sufficiently reliable read operation.

For this purpose, the invention provides a read-only memory (ROM) array comprising a matrix of ROM cells arranged in rows and in columns, the cells of a same row being connected to a word line dedicated to this row. The matrix is divided into segments each comprising a given number of successive rows. The memory array furthermore comprises two metallization levels, lower and upper respectively, overlaid above the cell matrix. Two bit lines are respectively arranged in the two levels above each cell, and are oriented substantially parallel to the direction of the columns. The bit lines of the memory array are paired so that a signal for reading a binary value stored in a cell connected to a bit line belonging to a pair is detected by comparing it with a signal reference level supplied by the other bit line of the same pair. Some of the bit lines are also arranged into groups of four bit lines overlaid two on two in the lower and upper metallization levels above two columns of cells in a first segment of the matrix, so that the configuration of the bit lines of at least one of these groups in a second matrix segment adjacent to the first segment corresponds to a circular permutation of said bit lines with respect to the configuration in the first segment of the matrix. At least one bit line of said group passes from one level of metallization to the other between the first and second segments of the matrix, and at least one bit line from said group is situated above two different columns in the first and second segments of the matrix.

In a ROM array according to the invention, a bit line of the array is used to deliver a signal reference level during the detection of a signal for reading a binary value on another bit line. In other words, the memory array is of the type for differential detection of a read signal. It therefore achieves a high reliability for reading the stored data.

Given that, in a memory array according to the invention, two portions of bit lines are overlaid above each memory cell, the arrangement of the bit lines above the cell matrix can have a high density. This arrangement is compatible with a memory array whose cells are of greatly reduced dimensions, such as, for example, ROM memory cells with a single transistor. It also allows a memory array with a very high level of integration to be fabricated.

Some bit lines are shifted in a direction parallel to the rows of cells, between two successive segments of the matrix, and other bit lines are transferred from one metallization level to the other, between the same two segments of matrix. The bit lines that are adjacent to one another therefore vary from one matrix segment to the other. The result of this is that a given bit line is adjacent to respective portions of a higher number of other bit lines, over the whole length of the memory array in a direction parallel to the columns. It therefore undergoes interactions with each of these portions which depend on their respective electrical states. By an averaging effect, the resultant interaction to which a given bit line is subject is substantially constant and identical for all the bit lines of the array. The effect of these interactions on a read signal transmitted by a given bit line is then effectively eliminated during the differential detection of the signal. The read reliability of a data bit stored in an array according to the invention is therefore especially high.

Moreover, thanks to the use of two metallization levels for laying the bit lines above the ROM memory cells, an output interface from the memory array may easily be arranged on one side of the latter. This is because there is then sufficient room, on the side of the output interface opposite to the memory cell matrix, for connecting outputs from the interface to external circuits for which the data being read is destined.

Lastly, no additional separation interval is required between the cells for accommodating the word lines. The cells within the matrix can therefore be configured with a maximum density, which allows the integration level of the ROM array to be further increased.

Certain improvements in the invention allow the read reliability of the data stored in the ROM array to be further increased. Other improvements allow the design and the fabrication of the memory array to be simplified. Amongst all these improvements in the invention, the following may be mentioned:

the two columns, above which the bit lines of one and the same group are situated in one segment of the matrix, are adjacent;

the four bit lines of each group are situated above two columns of the matrix that are dedicated to said group over a whole length of said matrix in a direction parallel to the columns;

each group of four bit lines comprises two pairs of bit lines that are paired two by two for the detection of a read signal by comparing it with a signal reference level;

for each group of four bit lines, two bit lines of said group that are paired with one another for the detection of a read signal are situated above different columns of the matrix and in different metallization levels, in each segment of the matrix;

the ROM array can comprise a first type of groups of four bit lines, for which the configuration of the four bit lines of the same group in any first segment of the matrix is obtained by the same first circular permutation starting from the configuration of these bit lines in the matrix segment just preceding said first segment, in the direction of the columns in a given sense;

the ROM array may comprise a second type of groups of four bit lines, for which the configuration of the four bit lines of the same group in any first segment of the matrix is obtained three times out of four by the same second circular permutation, and once in four times by a permutation that is the inverse of said second circular permutation starting from the configuration of these bit lines in the matrix segment just preceding said first segment, in the direction of the columns in the given sense;

lastly, the ROM array may comprise groups of four bit lines of the first type described above and groups of four bit lines of the second type, interspersed one by one in the direction of the rows of the matrix.

According to an embodiment of the present invention, an integrated circuit comprises a circuit supporting substrate with an electronic circuit disposed thereon, the electronic circuit includes at least one read-only memory (ROM) array fabricated in accordance with the present invention.

Further, in accordance with an embodiment of the invention, an information processing system comprises a processor and memory, communicatively coupled with the processor. The memory includes one or more ROM memory devices. At least one ROM memory device includes at least one ROM array fabricated according to the present invention.

BRIEF DESCRIPTION OF THE DRAWINGS

Other features and advantages of the present invention will become apparent in the following description of non-limiting exemplary embodiments, making reference to the appended drawings, in which:

FIG. 1 is a perspective view of an integrated circuit comprising a ROM array to which the invention is applied;

FIGS. 2a and 2b are two diagrams illustrating displacements of bit lines in a ROM array according to FIG. 1, according to a first embodiment of the invention;

FIG. 5 illustrates an implementation alternative of the invention.

DETAILED DESCRIPTION

Figure 3A:
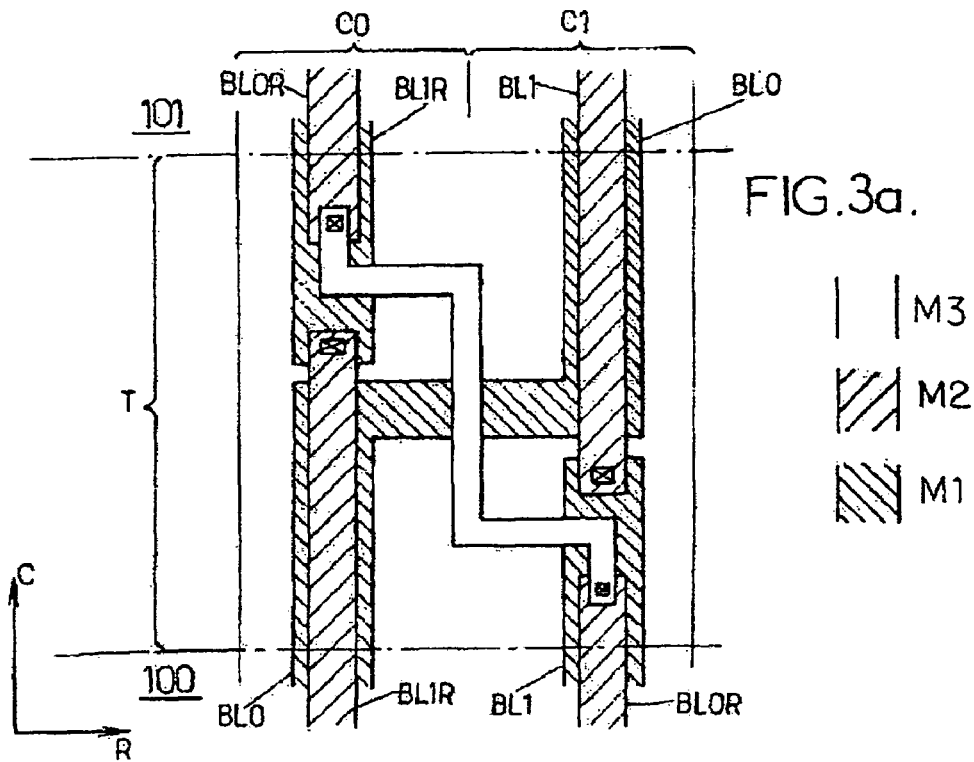
FIGS. 3a and 3b illustrate transitions between successive segments of matrix of a ROM array according to FIGS. 2a and 2b.

FIG. 1 shows a ROM array to which the invention is applied. ROM memory cells 10 are arranged according to a matrix M0 on the surface of an integrated circuit semiconductor substrate 1000. Each cell 10 has a structure that is known to those skilled in the art: it comprises an MOS transistor, not shown, that sits on the surface of the substrate 1000 and which is connected by its source to a ground terminal of the memory array. The cells 10 are arranged in rows referenced R0, R1, R2, . . . , and in columns referenced C0, C1, C2, . . . , respectively parallel to two directions R and C that are substantially perpendicular to one another. In the following, i denotes a column number of the matrix M0, and j denotes a row number. Each transistor of a cell 10 of the row j has a gate connected to a word line referenced WLj. The word line WLj can be formed within the transistor gate level, in the form of continuous links between the gates of the transistors of the cells belonging to the row j.

Furthermore, two metallization levels, lower and upper respectively, are disposed over the substrate 1000 in the direction N perpendicular to the surface of the substrate 1000. The lower metallization level is situated between the substrate 1000 and the upper metallization level.

According to a first embodiment of the invention, the lower and upper metallization levels are respectively the first and the second metallization layers disposed above the surface of the substrate 1000, when the ROM array is fabricated according to a usual integrated electronic circuit structure. They are denoted M1 and M2, respectively. For any given column Ci, two bit lines parallel to the direction C are respectively arranged in the metallization levels M1 and M2. Depending on the binary value stored in a cell 10 of the matrix M0, the drain of this cell is connected or not to that of the two bit lines which is disposed in the level M1 above the cell. For example, in FIG. 1, the bit lines of the column C0 are referenced BL0 and BL1R, and the drain of the cell transistor situated at the intersection of the column C0 and the row R0 is connected or not to the bit line BL0. Similarly, the drain of the cell transistor situated at the intersection of the column C1 and the row R0 is connected or not to the bit line BL1. Generally speaking, the bit lines are referenced BLi and BLiR, where i is the number of the column (Ci) corresponding to the bit line BLi in the row R0. A differential read amplifier for the ROM array, not shown, is configured so as to compare a read signal of a bit stored in a cell 10, connected to the bit line BLi, with a read signal reference level supplied by the bit line BLiR (R for 'reference').

FIG. 2a is a top view of a ROM array according to FIG. 1, configured according to the invention. The matrix M0 is divided into successive segments of matrix, referenced 100, 101, 102, etc. In the example described, each matrix segment corresponds to four rows that are successive in the direction C, but it will be understood that the number of rows per matrix segment can be any number. All the segments of the matrix preferably comprise the same number of rows.

Within each matrix segment 100, 101, 102, . . . , the bit lines are formed by rectilinear portions of conducting tracks, parallel to the direction C and each disposed within one of the two metallization levels M1 and M2. Although two separate portions of bit line are overlaid above each cell 10 in a direction N, these portions of bit line are shown offset in the direction R with respect to one another for reasons of clarity in FIG. 2a. A portion of bit line situated in the level M1 is shown as a dashed line, and a portion of bit line situated in the level M2 is shown as a solid line.

Two successive segments of matrix are separated by a transistion region T, in which the bit lines are shifted parallel to the direction R or parallel to the direction N. A bit line that is shifted in a transition region T parallel to the direction N switches from the metallization level M1 to the metallization level M2, or vice versa, between the two segments of matrix that are separated by this transition region. The portions of the same bit line in the segments of matrix situated on either side of a transition region are linked by dotted lines. The formation of the links between the portions of the same bit line across a transition region T will be described later.

FIG. 2b corresponds to FIG. 2a by illustrating, in a way that is different from the latter but equivalent, the arrangement of the bit lines in the ROM array. FIG. 2b shows successive sections of matrix 100, . . . , 108, in planes parallel to the directions R and N. Two segments are separated by a transition region T, in which arrows represent the displacements that the bit lines undergo in going from one matrix segment to the next, in the direction of increasing matrix segment number. In each section, the metallization level M1 is shown underneath the metallization level M2. The reference i or iR of a bit line is indicated at the corresponding location, for each matrix segment, for each matrix column and for each metallization level.

An example of arrangement of the bit lines according to the invention is now described. The bit lines are arranged into groups of four bit lines: BL0, BL1, BL0R and BL1R for the first group, denoted P0 in FIGS. 2a and 2b, BL2, BL3, BL2R and BL3R for the second group denoted P1, BL4, BL5, BL4R and BL5R for the group P2, and BL6, BL7, BL6R and BL7R for the group P3. The columns C0 and C1 are dedicated to the group P0, C2 and C3 to the group P1, C4 and C5 to the group P2, and C6 and C7 to the group P3. Thus, a pair of adjacent columns is dedicated to each group of four bit lines. Within the group P1, the arrangement of the portions of the bit lines BL0, BL1, BL0R and BL1R in the matrix segment 101 is obtained by carrying out a circular permutation towards the left of the bit lines with respect to the positions of the portions of the same bit lines in the matrix segment 100. An identical permutation of the positions of the portions of the lines BL0, BL1, BL0R and BL1R is effected between any two segments of the matrix M0 that are successive in the direction C.

In the matrix segment 100, the portion of the bit line BL0 is situated in the level M1 and the column C0, the portion of the bit line BL0R is situated in the level M2 and the column C1, the portion of the bit line BL1 is situated in the level M1 and the column C1, the portion of the bit line BL1R is situated in the level M2 and the column C0. In this way, portions of two bit lines that are paired for the detection of a read signal are situated, within each matrix segment 100, 101, . . . , in different metallization levels and in different columns, even though they are adjacent to one another.

The positions of the portions of the bit lines of the group P2 in the various segments of the matrix M0 are obtained in the same way as for the group P0.

The arrangement of the portions of the bit lines of the group P1 above the successive segments of the matrix M0 are obtained in the following manner.

In the matrix segment 100, the portion of the bit line BL2 is situated in the level M1 and the column C2, the portion of the bit line BL2R is situated in the level M2 and the column C3, the portion of the bit line BL3 is situated in the level M1 and the column C3, the portion of the bit line BL3R is situated in the level M2 and the column C2.

The portions of the bit lines of the group P1 in the matrix segment 101 are configured by carrying out a circular permutation towards the left of the bit lines starting from their positions in the matrix segment 100. Circular permutations towards the left are applied in the same way for the bit lines of the group P1 in the transition regions T situated between the matrix segments 101 and 102, 102 and 103, 104 and 105, 105 and 106, 106 and 107. In contrast, inverse circular permutations, i.e. circular permutations towards the right, are applied in the transition regions T situated between the matrix segments 103 and 104 on the one hand, and 107 and 108 on the other, for the portions of the bit lines of the group P1.

The positions of the portions of the bit lines of the group P3 above the successive segments of the matrix M0 are obtained in the same manner as for the group P1.

It will be understood that the configuration of the bit lines described hereinabove may be extended to any given number of matrix segments and to any given number of groups of four bit lines.

Respective portions of two separate bit lines are able to interact with one another, in particular by capacitive coupling, when these portions are adjacent within the same metallization layer M1 or M2.

In the configuration of the bit lines described hereinabove, a given bit line BLi has no portion adjacent to a portion of the bit line BLiR, with which it is paired for detecting a read signal, within the same metallization level. This results in the signals detected on these two bit lines, during the read operation of a binary value stored in the ROM array, being independent from one another.

In addition, if a given bit line BLi or BLiR has a portion, within one of the metallization levels M1 or M2 and in one segment of the matrix, adjacent to a portion of the bit line BLi', where i' is a bit line index, then the bit line BLi or BLiR has another portion adjacent to a portion of the line BLi'R, within one of the two metallization levels in another segment of the matrix. Similarly, if a given bit line BLi or BLiR has a portion adjacent to a portion of the bit line BLi'R, then it also has a portion adjacent to a portion of the bit line BLi'. Thus, the bit line BL1 has a portion adjacent to the bit lines BL0 and BL2 in the segment 100 within the level M1. It also has portions adjacent to the bit lines BL0R and BL2R, in the segment 103 and in the segment 104, respectively, within the level M1. This symmetry of proximity between a portion of bit line and respective portions of two other paired bit lines produces a symmetry of the capacitive interactions between all the bit lines. In this way, each bit line delivers a particularly reliable read signal during a read operation in a cell connected to the latter. At the same time, each bit line supplies a particularly stable signal reference level during a read operation in a cell connected to the bit line paired with it. The level of reliability of each read operation in such a ROM array is therefore particularly high.

Figure 3B:
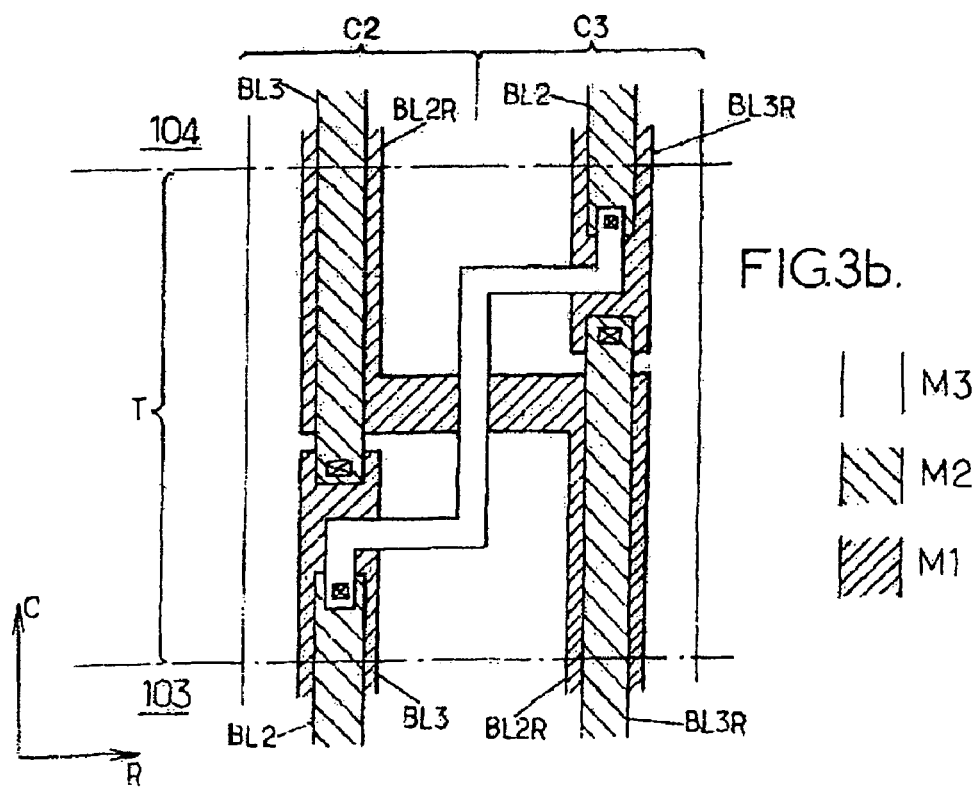

FIGS. 3a and 3b illustrate two transition regions T, respectively between the matrix segments 100 and 101 for the columns C0 and C1, and between the matrix segments 103 and 104 for the columns C2 and C3. A third metallization level, denoted M3, is used in these transition regions in order to effect some of the displacements of the bit lines. The metallization level M3 is situated above the metallization level M2, in the direction N. The crosses indicate the locations of vias between two metallization levels overlaid immediately above one another. The widths of the tracks in the transition regions shown are not the real widths, but fictitious widths adopted for reasons of clarity of the figure. Thus, FIG. 3a illustrates a circular permutation of the bit lines towards the left between the metallization levels M1 and M2 and the adjacent columns C0 and C1, and FIG. 3b illustrates a circular permutation of the bit lines towards the right between the metallization levels M1 and M2 and the adjacent columns C2 and C3.

The word lines WL0, WL1, . . . are arranged in the cell transistor gate level, between the surface of the substrate 1000 and the first metallization level M1. Tracks for doubling up the word lines may then be arranged in the third metallization level M3, above the level M2. These line-doubling tracks are respectively connected to the word lines by connections running through the metallization layers M1 and M2. These connections are situated on two sides of the ROM array that are opposite in the direction R of the cell rows.

According to a second embodiment of the invention, the lower and upper metallization levels are respectively the first metallization level M1 and the third metallization level M3 of the integrated circuit that incorporates the ROM array. One advantage of this second embodiment resides in the fact that any coupling that could be present between portions of bit lines overlaid above the same column of the matrix within the same segment is reduced, since these portions are separated by the metallization level M2.

Figure 4A:
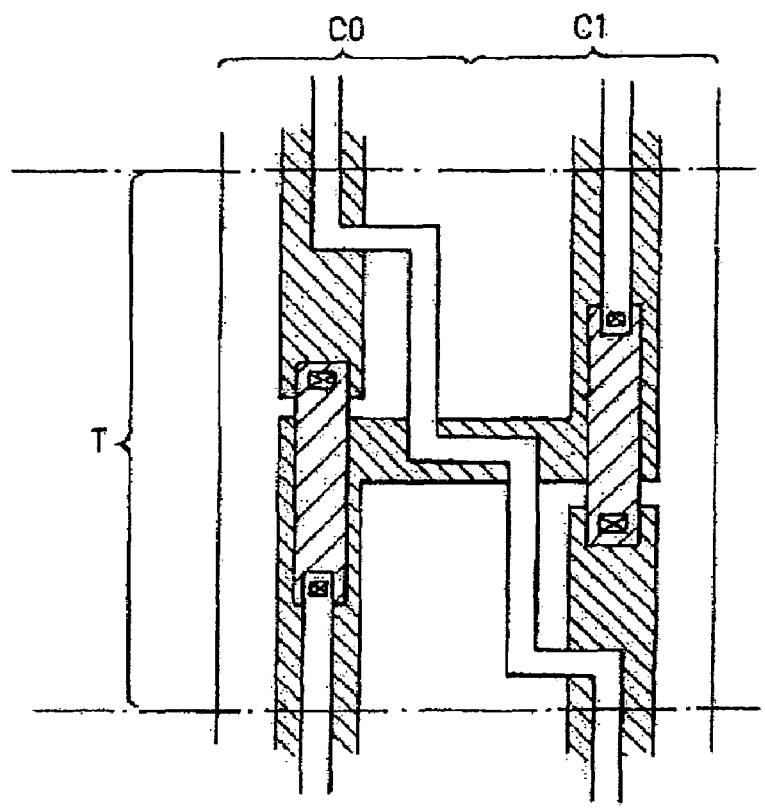
FIGS. 4a and 4b illustrate transitions between segments of matrix of a ROM array according to a second embodiment of the invention.
Figure 4B:
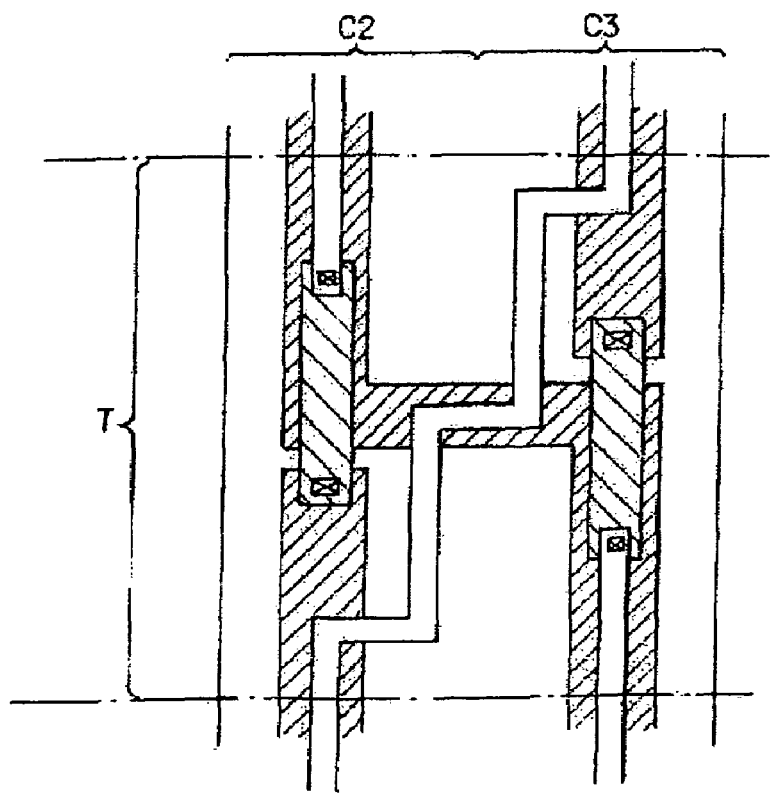

Portions of tracks are then arranged within the metallization level M2, between the levels M1 and M3, in the transition regions in order to effect displacements of the bit lines in the directions R and N. FIGS. 4a and 4b correspond respectively to FIGS. 3a and 3b, for this second embodiment. FIG. 4a thus illustrates a permutation of the bit lines towards the left and FIG. 4b illustrates a permutation towards the right, between successive segments of the matrix, for the metallization levels M1 and M3 and for two adjacent columns.

The word lines WL0, WL1, . . . are arranged again in the cell transistor gate level that is intermediate between the surface of the substrate 1000 and the first metallization level M1. The word-line doubling tracks can then be arranged in the second metallization level M2. They are respectively connected to the word lines by connections running through the first metallization layer M1, on two sides of the ROM array that are opposite in the direction R of the cell rows.

It will be understood that numerous design variants may be introduced with respect to the two ROM arrays described in detail hereinabove. In particular, transition regions T having different configurations from those described with reference to FIGS. 3a, 3b, 4a and 4b may be used, while still carrying out identical displacements of the bit lines.

Furthermore, circular permutations of the bit lines of the same group of four lines, between the lower and upper metallization levels and between the two columns dedicated to this group, may be used that are different from the circular permutations towards the left and towards the right described hereinabove with reference to FIG. 2b. In particular, circular permutations where the bit lines cross corresponding to diagonal positions may be used. FIG. 5 illustrates such a circular permutation where the lines cross, for bit lines numbered w, x, y and z.

In a known manner, a metal screen can be advantageously arranged within a metallization layer situated above the metallization layers that contain the bit lines. Such a screen prevents the bit lines from acting as antennas for electromagnetic radiation originating from sources external to the ROM array. Finally, several ROM arrays such as has been described may be fabricated on the surface of the same substrate, and may be connected to the same output interface common to the said arrays. Such a structure allows large storage capacitances to be achieved, without reproducing certain interfacing components for the array output. For this purpose, multiplexing of the bit lines coming from the various arrays is implemented upstream of the output interface, a solution which is known per se to those skilled in the art.

While there has been illustrated and described what is presently considered to be embodiments of the present invention, it will be understood by those of ordinary skill in the art that various other modifications may be made, and equivalents may be substituted, without departing from the true scope of the present invention.

Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. A read-only memory (ROM) array comprising a matrix of ROM cells arranged in rows and in columns, the cells of a same row being connected to a word line dedicated to said row, and comprising:
   two metallization levels, lower and upper respectively, overlaid above the cell matrix; and
   two bit lines being respectively arranged in the two levels above each cell of the cell matrix, and being oriented substantially parallel to the direction of the columns,
   the bit lines of the memory array being paired so that a signal for reading a binary value stored in a cell connected to a bit line belonging to a pair is detected by comparing it with a signal reference level supplied by the other bit line of said pair,
   the matrix being divided into segments each comprising a given number of successive rows, and
   wherein at least some of the bit lines are also arranged into groups of four bit lines overlaid two on two in the lower and upper metallization levels above two columns of cells in a first segment of the matrix, so that the configuration of the bit lines of at least one of said groups in a second matrix segment adjacent said first segment corresponds to a circular permutation of said bit lines with respect to the configuration in the first segment of the matrix,
   at least one bit line of said group passing from one level of metallization to the other between said first and second segments of the matrix, and at least one bit line from said group being situated above two different columns in said first and second segments of the matrix.

2. The ROM array according to claim 1, wherein the two columns, above which the bit lines of one and the same group are situated in one segment of the matrix, are adjacent.

3. The ROM array according to claim 1, wherein the four bit lines of each group are situated above two columns of the matrix that are dedicated to said group over a whole length of said matrix in a direction parallel to the columns.

4. The ROM array according to claim 3, wherein the two columns of the matrix that are dedicated to one and the same group of four bit lines are adjacent.

5. The ROM array according to claim 1, wherein each group of four bit lines comprises two pairs of bit lines that are paired two by two for the detection of a read signal by comparing it with a signal reference level.

6. The ROM array according to claim 5, wherein, for each group of four bit lines, two bit lines of said group that are paired with one another for the detection of a read signal are situated above different columns of the matrix and in different metallization levels, in each segment of the matrix.

7. The ROM array according to claim 1, wherein, for a first type of groups of four bit lines, the configuration of the four bit lines of a same group in any first segment of the matrix is obtained by the same first circular permutation starting from the configuration of the bit lines of said group in the matrix segment just preceding said first segment, in the direction of the columns in a given sense.

8. The ROM array according to claim 7, further comprising groups of four bit lines of the first type and groups of four bit lines of the second type, interspersed one by one in the direction of the rows of the matrix.

9. The ROM array according to claim 1, wherein, for a second type of groups of four bit lines, the configuration of the four bit lines of a same group in any first segment of the matrix is obtained three times out of four by a same second circular permutation, and once in four times by a permutation that is the inverse of said second circular permutation starting from the configuration of the bit lines of said group in the matrix segment just preceding said first segment, in the direction of the columns in a given sense.

10. The ROM array according to claim 9, further comprising groups of four bit lines of the first type and groups of four bit lines of the second type, interspersed one by one in the direction of the rows of the matrix.

11. An integrated circuit comprising:
   a circuit supporting substrate with an electronic circuit disposed thereon, the electronic circuit including:
   a read-only memory (ROM) array comprising a matrix of ROM cells arranged in rows and in columns, the cells of a same row being connected to a word line dedicated to said row, and comprising:
   two metallization levels, lower and upper respectively, overlaid above the cell matrix; and
   two bit lines being respectively arranged in the two levels above each cell of the cell matrix, and being oriented substantially parallel to the direction of the columns,
   the bit lines of the memory array being paired so that a signal for reading a binary value stored in a cell connected to a bit line belonging to a pair is detected by comparing it with a signal reference level supplied by the other bit line of said pair,
   the matrix being divided into segments each comprising a given number of successive rows, and
   wherein at least some of the bit lines are also arranged into groups of four bit lines overlaid two on two in the lower and upper metallization levels above two columns of cells in a first segment of the matrix, so that the configuration of the bit lines of at least one of said groups in a second matrix segment adjacent said first segment corresponds to a circular permutation of said bit lines with respect to the configuration in the first segment of the matrix,
   at least one bit line of said group passing from one level of metallization to the other between said first and second segments of the matrix, and at least one bit line from said group being situated above two different columns in said first and second segments of the matrix.

12. The integrated circuit of claim 11, wherein, for each group of four bit lines, two bit lines of said group that are paired with one another for the detection of a read signal are situated above different columns of the matrix and in different metallization levels, in each segment of the matrix.

13. The integrated circuit of claim 11, wherein, for a first type of groups of four bit lines, the configuration of the four bit lines of a same group in any first segment of the matrix is obtained by the same first circular permutation starting from the configuration of the bit lines of said group in the matrix segment just preceding said first segment, in the direction of the columns in a given sense.

14. The integrated circuit of claim 11, wherein, for a second type of groups of four bit lines, the configuration of the four bit lines of a same group in any first segment of the matrix is obtained three times out of four by a same second circular permutation, and once in four times by a permutation that is the inverse of said second circular permutation starting from the configuration of the bit lines of said group in the matrix segment just preceding said first segment, in the direction of the columns in a given sense.

15. An information processing system comprising:
a processor; and
memory, communicatively coupled with the processor, and wherein the memory includes at least one read-only memory (ROM) memory device comprising:
a ROM array comprising a matrix of ROM cells arranged in rows and in columns, the cells of a same row being connected to a word line dedicated to said row, and comprising:
two metallization levels, lower and upper respectively, overlaid above the cell matrix; and
two bit lines being respectively arranged in the two levels above each cell of the cell matrix, and being oriented substantially parallel to the direction of the columns,
the bit lines of the memory array being paired so that a signal for reading a binary value stored in a cell connected to a bit line belonging to a pair is detected by comparing it with a signal reference level supplied by the other bit line of said pair,
the matrix being divided into segments each comprising a given number of successive rows, and
wherein at least some of the bit lines are also arranged into groups of four bit lines overlaid two on two in the lower and upper metallization levels above two columns of cells in a first segment of the matrix, so that the configuration of the bit lines of at least one of said groups in a second matrix segment adjacent said first segment corresponds to a circular permutation of said bit lines with respect to the configuration in the first segment of the matrix,
at least one bit line of said group passing from one level of metallization to the other between said first and second segments of the matrix, and at least one bit line from said group being situated above two different columns in said first and second segments of the matrix.

16. The information processing system of claim 15, wherein
for a first type of groups of four bit lines, the configuration of the four bit lines of a same group in any first segment of the matrix is obtained by the same first circular permutation starting from the configuration of the bit lines of said group in the matrix segment just preceding said first segment, in the direction of the columns in a given sense; and
for a second type of groups of four bit lines, the configuration of the four bit lines of a same group in any first segment of the matrix is obtained three times out of four by a same second circular permutation, and once in four times by a permutation that is the inverse of said second circular permutation starting from the configuration of the bit lines of said group in the matrix segment just preceding said first segment, in the direction of the columns in a given sense.

* * * * *